(12) United States Patent
Hsu et al.

(10) Patent No.: US 9,484,098 B1
(45) Date of Patent: Nov. 1, 2016

(54) SMART REREAD IN NONVOLATILE MEMORY

(71) Applicant: SanDisk Technologies, Inc., Plano, TX (US)

(72) Inventors: Jonathan Hsu, Newark, CA (US); Gautam Dusija, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/819,211

(22) Filed: Aug. 5, 2015

(51) Int. Cl.
*G11C 16/04* (2006.01)
*G11C 29/04* (2006.01)
*G11C 11/56* (2006.01)
*G11C 16/10* (2006.01)
*G11C 16/26* (2006.01)

(52) U.S. Cl.
CPC ....... *G11C 16/0483* (2013.01); *G11C 11/5628* (2013.01); *G11C 11/5642* (2013.01); *G11C 16/10* (2013.01); *G11C 16/26* (2013.01); *G11C 29/04* (2013.01)

(58) Field of Classification Search
CPC ... G11C 11/5642; G11C 16/26; G11C 16/10; G11C 11/5628
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 8,243,514 B2 * | 8/2012 | Kang | G11C 11/5642 365/185.03 |
| 8,514,646 B1 * | 8/2013 | Nan | G11C 11/5642 365/185.02 |
| 2012/0220088 A1 | 8/2012 | Alsmeier | |
| 2013/0107628 A1 | 5/2013 | Dong et al. | |
| 2013/0194883 A1 * | 8/2013 | Lee | G11C 29/04 365/201 |
| 2013/0229846 A1 | 9/2013 | Chien et al. | |
| 2014/0229131 A1 * | 8/2014 | Cohen | G11C 16/0483 702/64 |
| 2016/0042797 A1 * | 2/2016 | Kim | G11C 16/26 714/764 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner* — Richard Elms
*Assistant Examiner* — Ajay Ojha
(74) *Attorney, Agent, or Firm* — Davis Wright Tremaine LLP

(57) ABSTRACT

A population of memory cells are programmed and an indicator of a first number of the memory cells programmed to a first state is recorded. Subsequently, a first read operation is performed using a first set of read parameters to identify a second number of the memory cells that are read as being in the first state. The difference between the first number and the second number is determined and a second set of read parameters for a second read (reread) is selected accordingly.

21 Claims, 14 Drawing Sheets

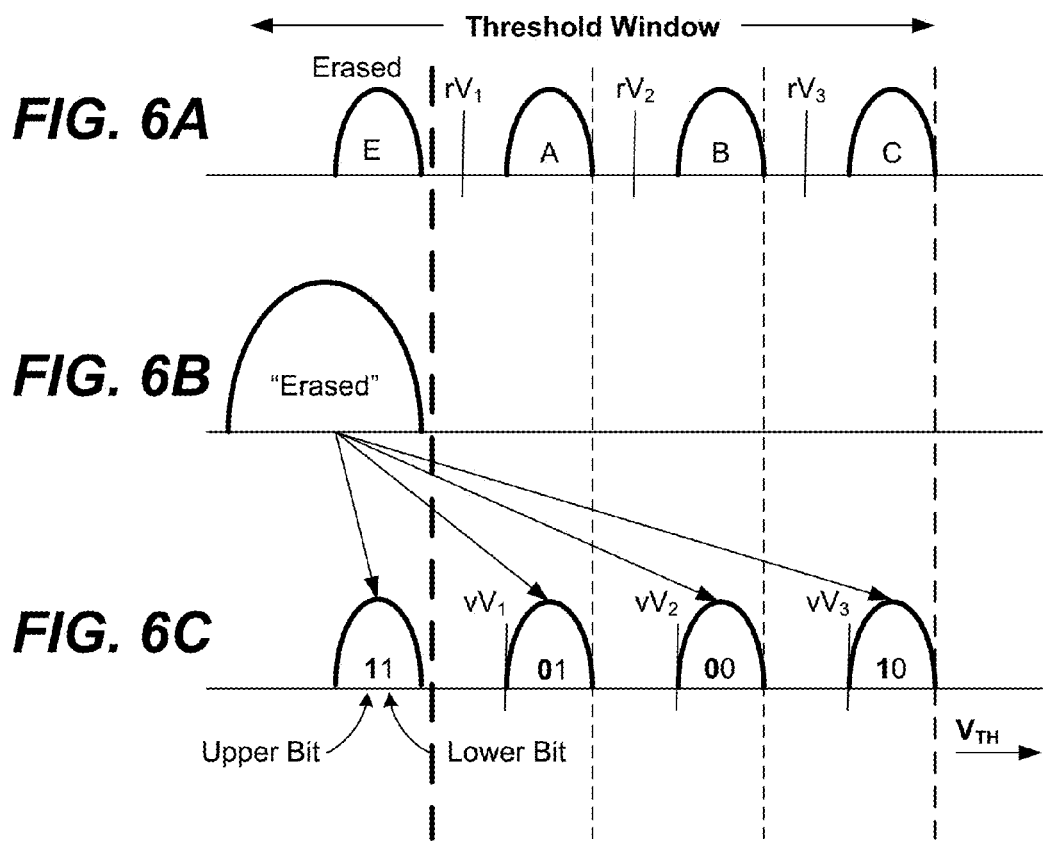
Programming into four states represented by a 2-bit code

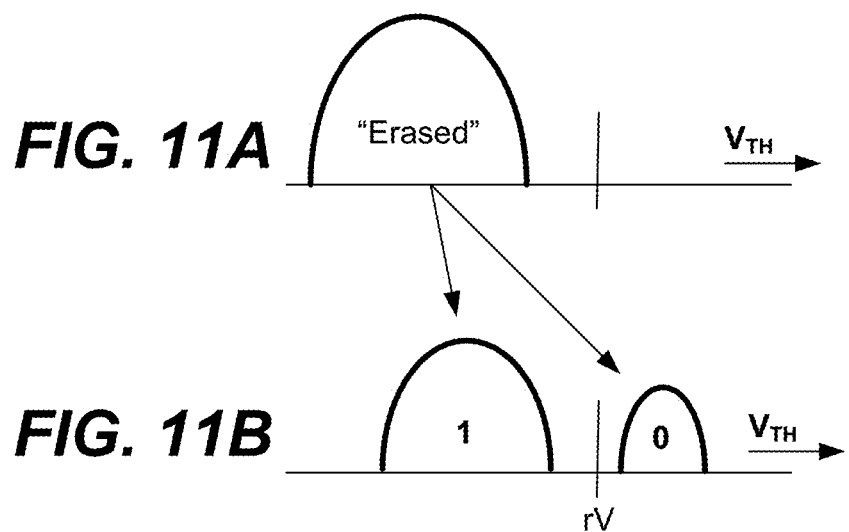
FIG. 11A
FIG. 11B
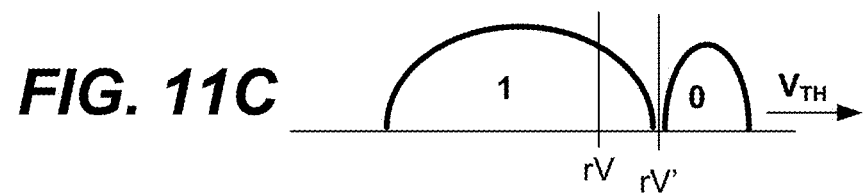
FIG. 11C
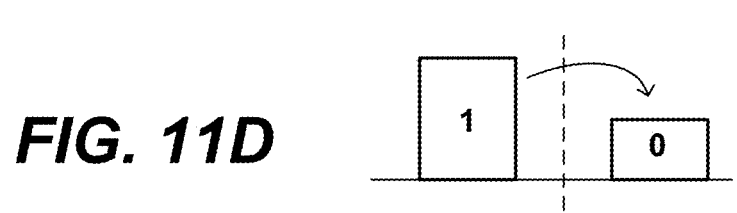
FIG. 11D
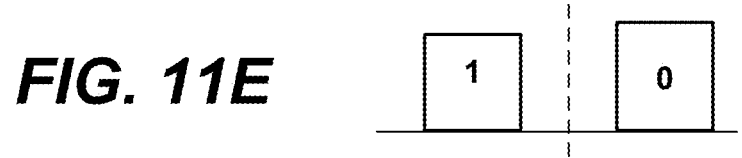
FIG. 11E

SMART REREAD IN NONVOLATILE MEMORY

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

SUMMARY

In some nonvolatile memory systems, when a large number of errors occur in data read from a memory, the data is reread using different read parameters. Appropriate reread parameters may be efficiently selected using information regarding any change in data shape (e.g. a change in the total number of memory cells within a given unit of data that are read as being in a given memory state). Data shape information may indicate the direction of a threshold voltage shift (either up or down) so that read parameters may be adjusted in the right direction (e.g. increasing or decreasing read voltage). Data shape information may also indicate the magnitude of a threshold voltage shift so that read parameters may be adjusted by the right amount. A record of initial data shape may be recorded for later comparison with data shape of read data. If data is scrambled, or otherwise shaped to achieve a desired shape, any deviation from the desired shape may be identified.

An example of a method of operating a flash memory includes: programming a population of memory cells to a plurality of states; recording an indicator of a first number of the memory cells programmed to a first state of the plurality of states; subsequently performing a first read operation using a first set of read parameters to identify a second number of the memory cells that are read as being in the first state; determining a difference between the first number and the second number; and selecting a second set of read parameters for a second read according to the difference.

The second set of read parameters may be selected from a finite number of predetermined sets of read parameters. Each of the finite number of predetermined sets of read parameters may include a different read voltage to be applied to a selected word line. The finite number of predetermined sets of read parameters may include predetermined sets with higher read voltages and predetermined sets with lower read voltages, the second set of read parameters selected from sets with either higher or lower read voltages according to whether the difference is positive or negative. A third set of read parameters may subsequently be selected, the third set of read parameters having a higher read voltage if the second set of read parameters has a higher read voltage and the third set of read parameters having a lower read voltage if the second set of read parameters has a lower read voltage. The plurality of states may include three or more states per cell including the first state and a second state, and an additional indicator of a number of memory cells programmed to the second state may be maintained. Indicators of numbers of memory cells programmed to each of the plurality of states may be maintained. The plurality of states may include three or more states per cell, memory cells programmed to the first state having higher threshold voltages than any other state of the plurality of states, and no indicators may be maintained of numbers of the memory cells programmed to other states of the plurality of states. The indicator may be a bit indicating that data is scrambled so that the population of memory cells is evenly distributed across the plurality of states.

An example of a method of operating a flash memory includes: reading a plurality of memory cells using a default set of read parameters; identifying a first number of memory cells of the plurality of memory cells that were read as being in a first state using the default set of read parameters; comparing the first number with an expected number of memory cells in the first state; if a difference between the first number and the expected number is less than a limit, then sending data read using the default set of read parameters to a memory controller; and if the difference between the first number and the expected number is greater than the limit, then rereading the plurality of memory cells using a modified set of read parameters, the modified set of read parameters chosen from a number of predefined sets of read parameters according to whether the difference is positive or negative.

The memory cells may be programmed to two memory states to store one bit per cell and the data may be scrambled so that the expected number of memory cells is half of the plurality of memory cells. The memory cells may be programmed to more than two memory states to store n bits per cell, where n is greater than 1, and the data may be scrambled so that the expected number of memory cells is 1/nth of the plurality of memory cells. Prior to reading the plurality of memory cells, an indicator of the number of memory cells in the first state may be stored, the expected number obtained from the indicator of the number of memory cells in the first state. The memory cells may be programmed to more than two memory states to store n bits per cell, and further comprising, prior to reading the plurality of memory cells, storing indicators of the numbers of memory cells in two or more of the memory states. The limit may reflect a number of bad bits that is correctable by error correction code.

An example of a NAND flash memory system includes: a plurality of flash memory cells each storing one or more bits of data; a read circuit configured to perform read operations using predefined sets of read parameters; a data analysis circuit configured to identify a difference between a first number of the plurality of flash memory cells programmed to a first state and a second number of the plurality of flash memory cells that are read by the read circuit as being in the first state using a first predefined set of read parameters; and a read parameter selection circuit configured to select a second predefined set of read parameters for the read circuit to reread the plurality of flash memory cells according to the difference identified by the data analysis circuit.

A data scrambling circuit may scramble data prior to storing scrambled data in the plurality of flash memory cells. A recording circuit may be configured to record data shape information including the first number. The plurality of flash memory cells may store more than one bit of data in more than two states per cell including the first state and a second state, and the recording circuit may record the first number and a second number of the flash memory cells in the second state. An error correction code circuit may correct errors in data read from the plurality of flash memory cells. The NAND flash memory may be a three-dimensional memory that monolithically formed in one or more physical levels of arrays of memory cells having an active area disposed above a silicon substrate.

Various aspects, advantages, features and embodiments are included in the following description of exemplary examples thereof, which description should be taken in conjunction with the accompanying drawings.

BRIEF DESCRIPTION OF THE DRAWINGS

FIGS. 6A-6C illustrate an example of programming a population of memory cells.

FIGS. 11A-E illustrate examples threshold voltage shifting that results in changing data shape.

DETAILED DESCRIPTION

Memory System

Figure 1:
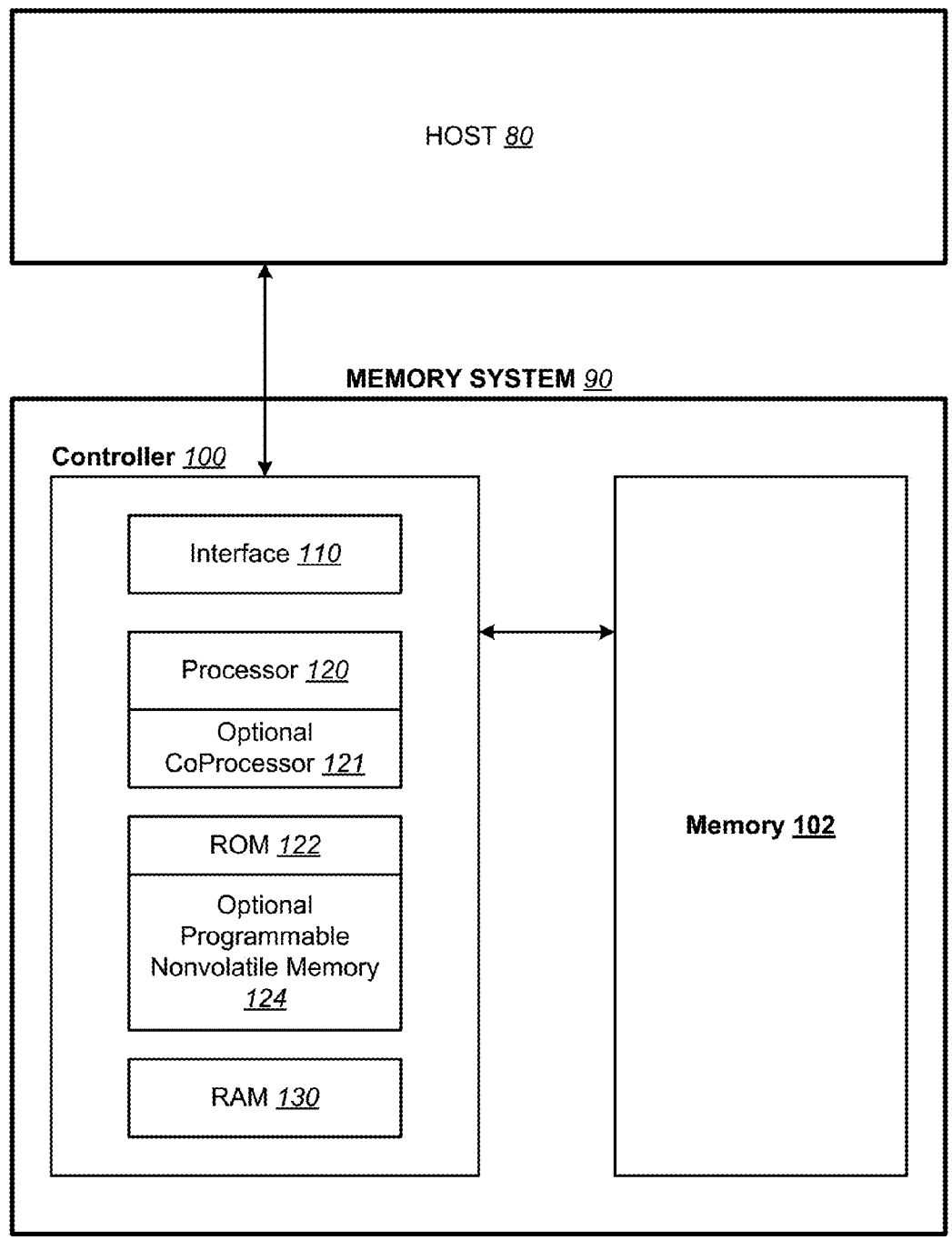
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
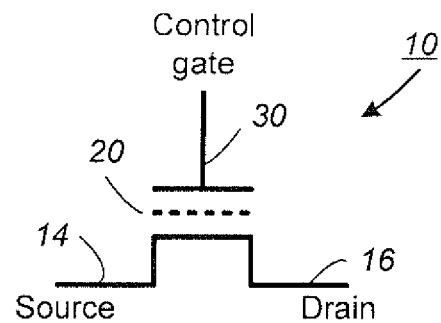
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
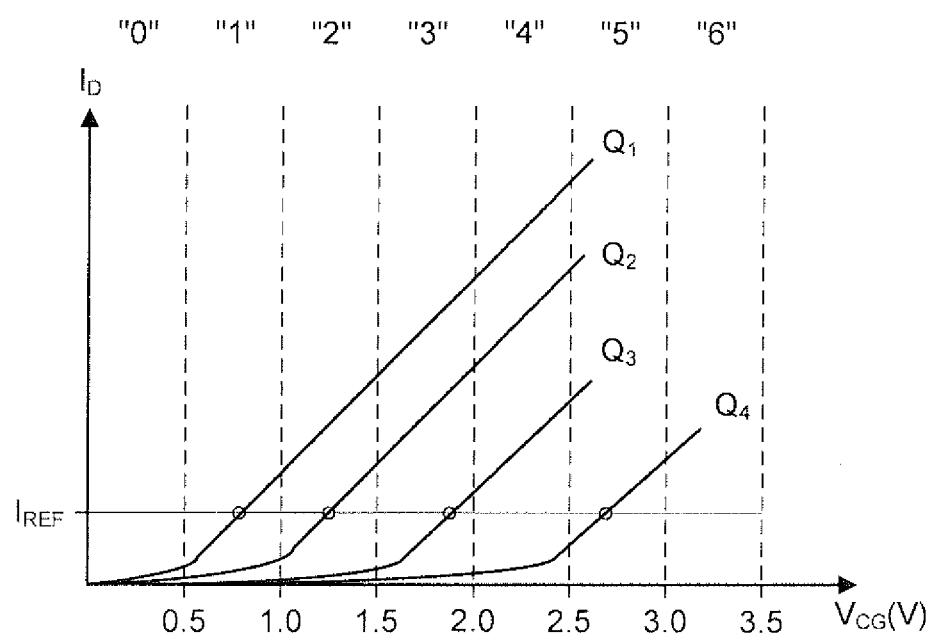
FIG. 3 illustrates the relation between the source-drain current $I_D$ and the control gate voltage $V_{CG}$ for four different charges Q1-Q4 that a floating gate may store.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
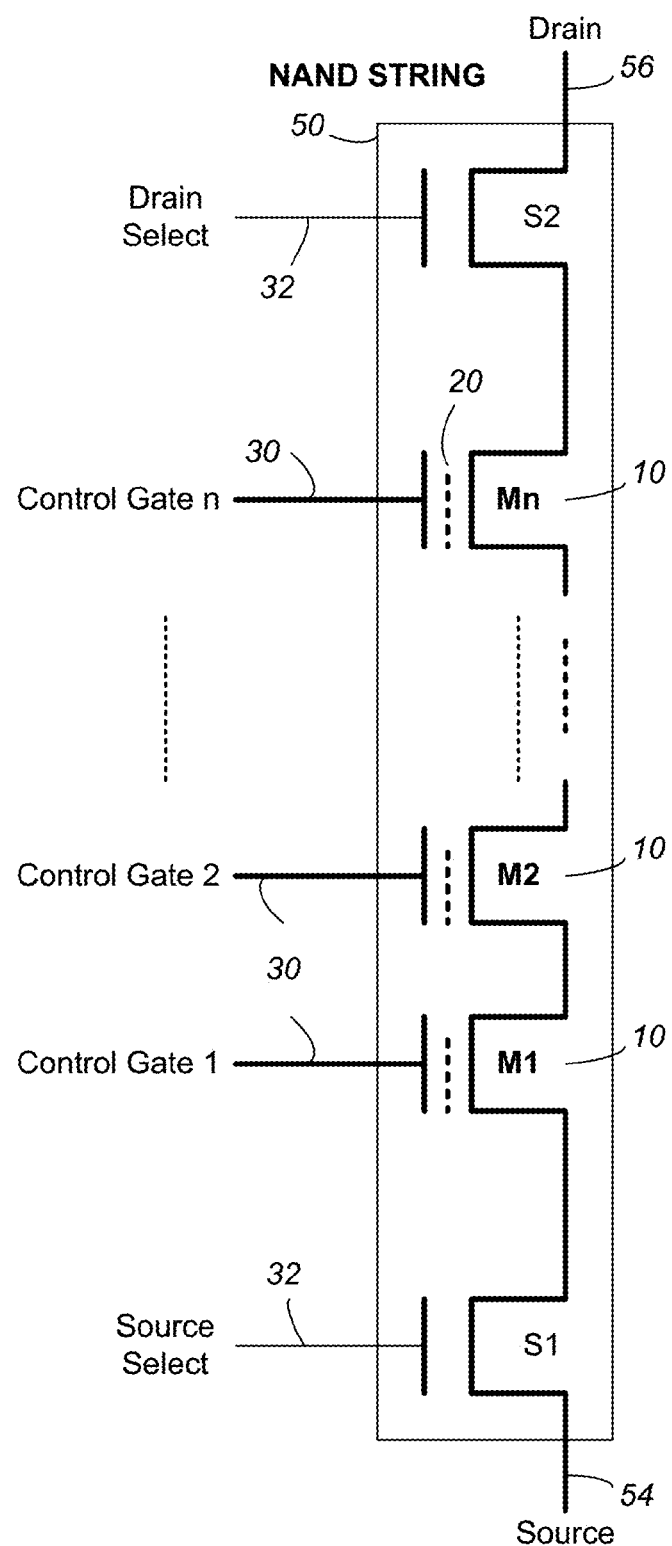
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
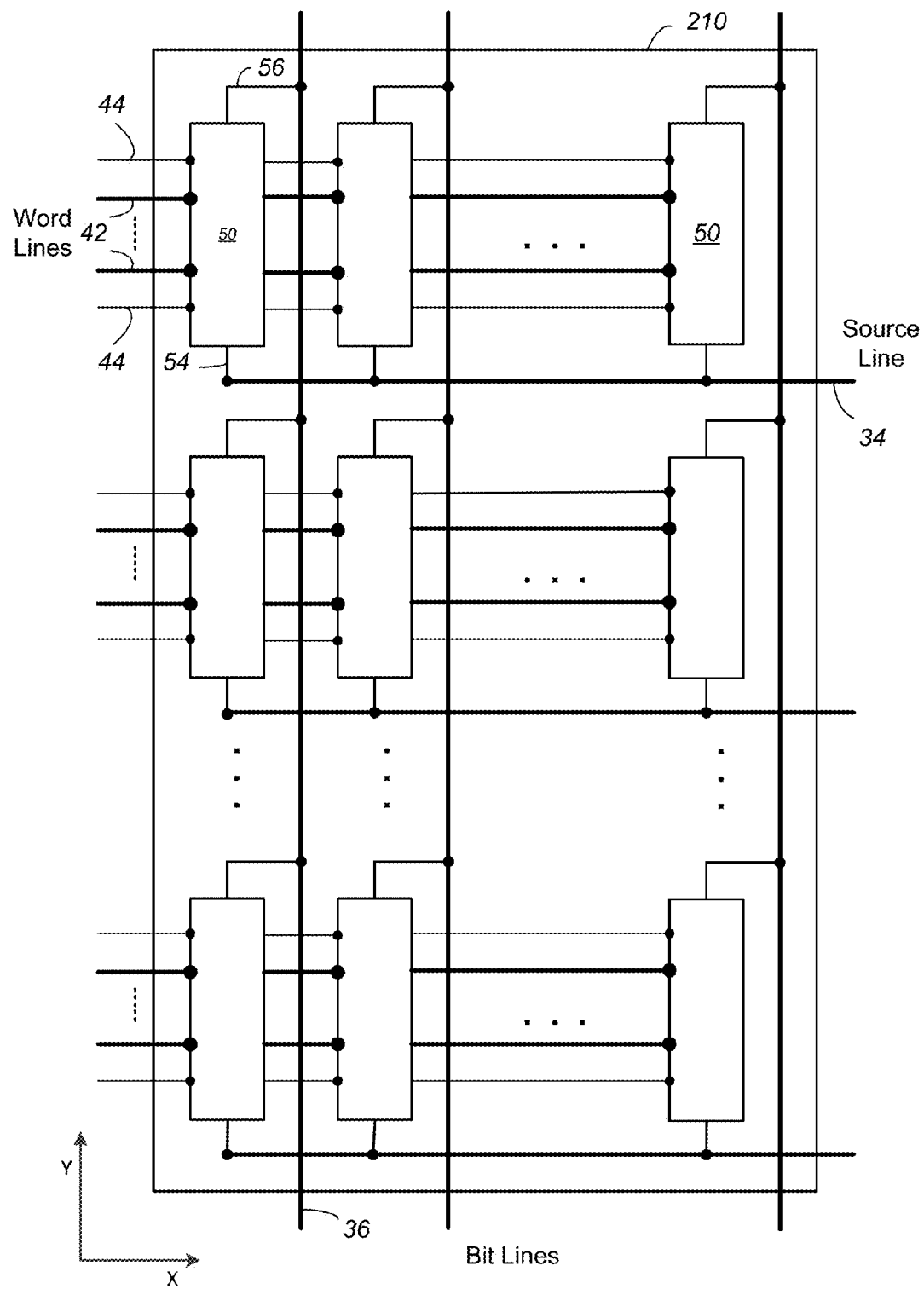
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
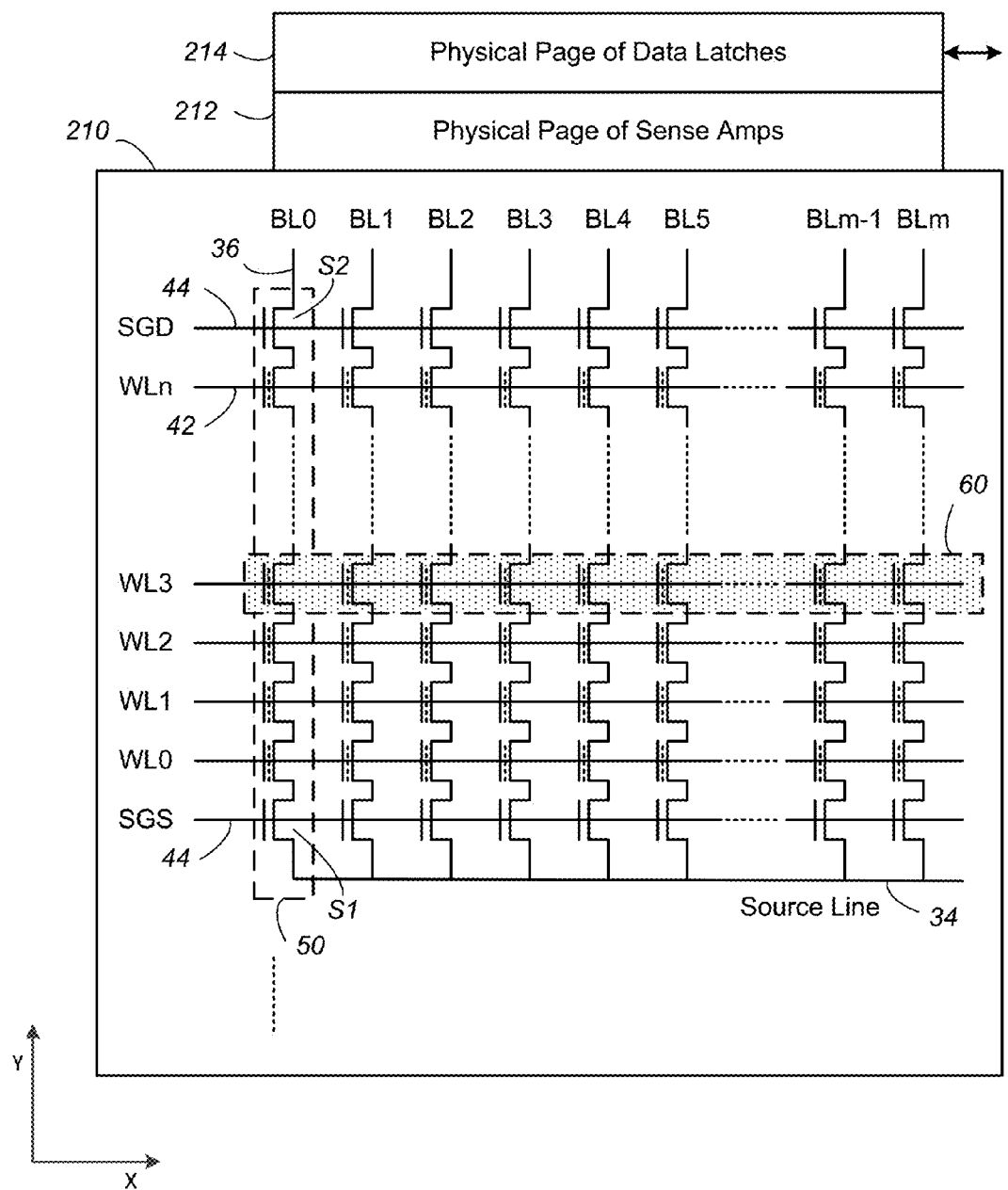
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell (a Single Level Cell, or SLC" memory), one physical page stores one logical page of data. In memories that store two bits per cell, a physical page stores two logical pages. The number of logical pages stored in a physical page thus reflects the number of bits stored per cell. The term Multi Level Cell, or "MLC" is generally used to refer to memories that store more than one bit per cell, including memories that store three bits per cell (TLC), four bits per cell, or more bits per cell (store n bits where n>1). In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figures 7, 8:
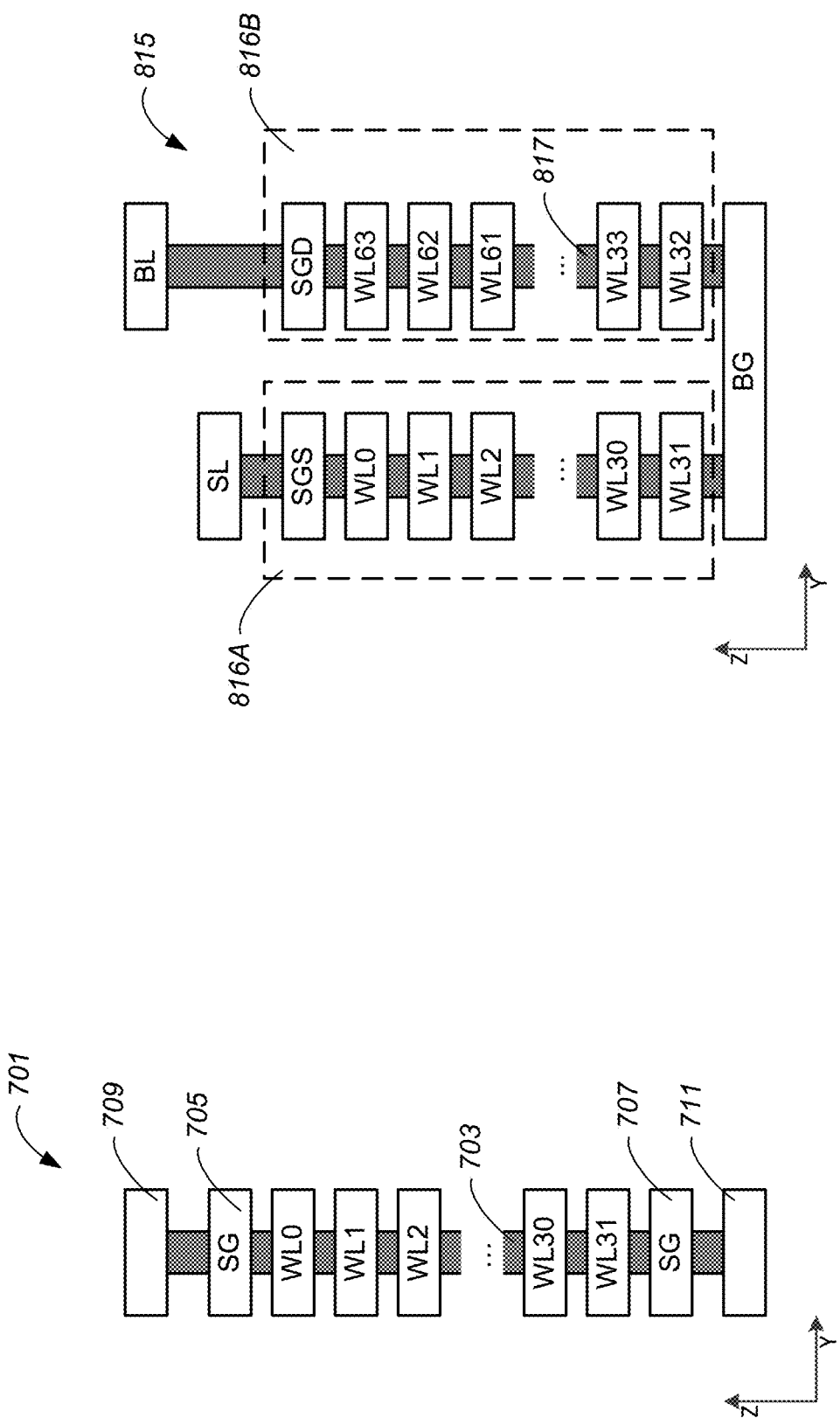
FIG. 7 shows an example of a physical structure of a 3-D NAND string.
FIG. 8 shows an example of a physical structure of a U-shaped 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
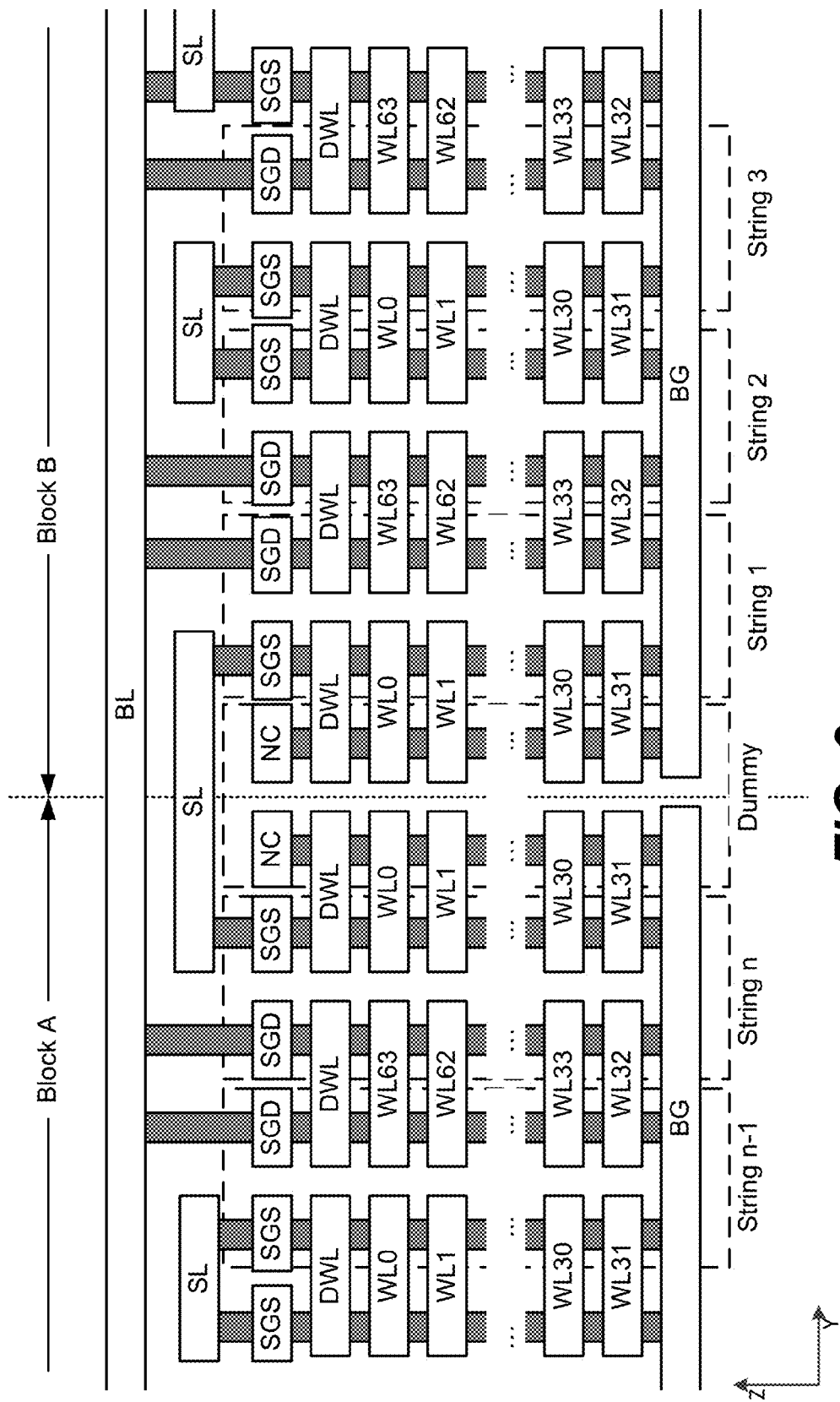
FIG. 9 shows an example of a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10:
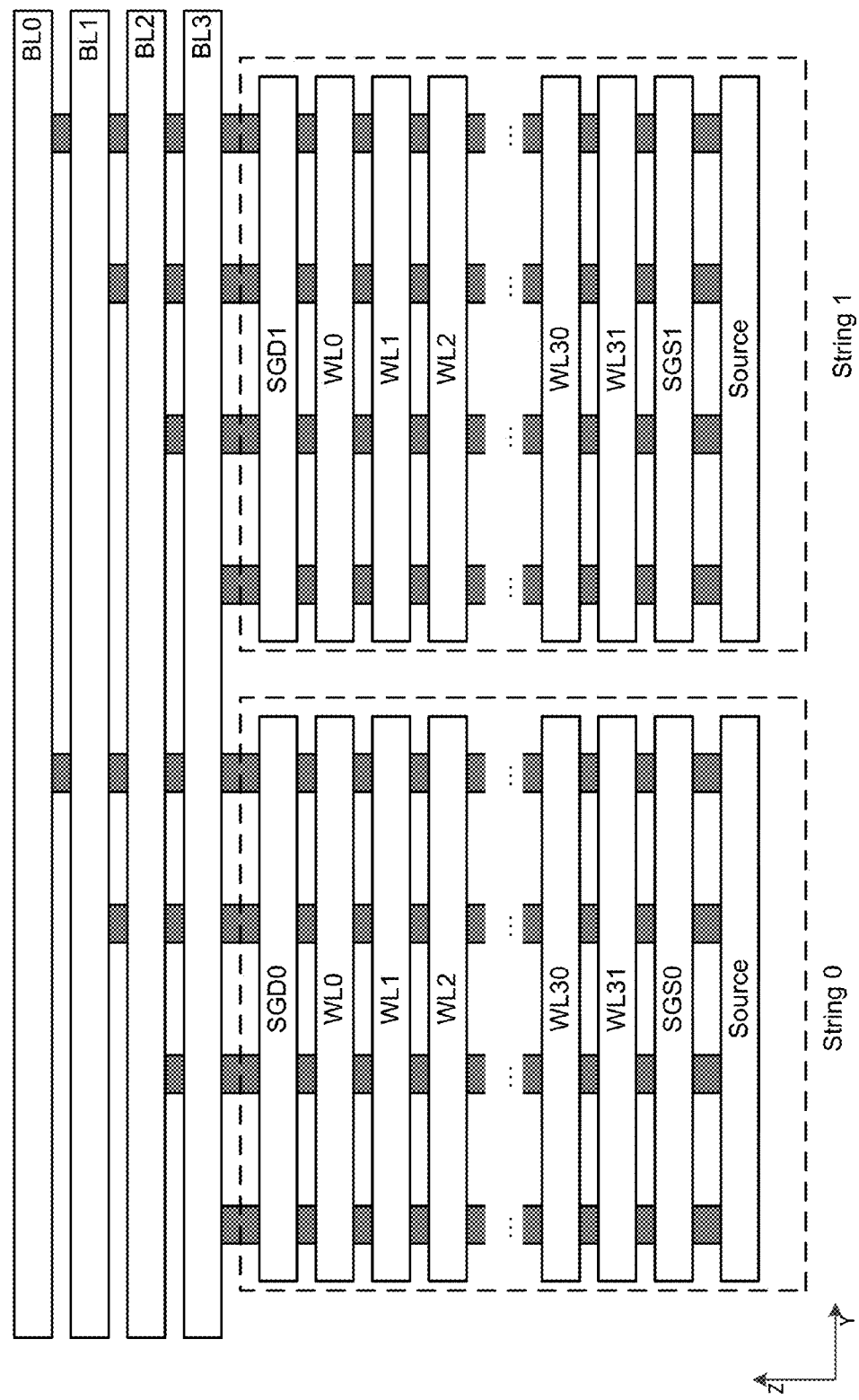
FIG. 10 shows an example of a cross section of a 3-D NAND memory with straight NAND strings in the y-z plane.

FIG. 10 shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. Memory hole structures extend down through these sheets of conductive material to form memory cells. Within a given block there are multiple NAND strings connected to a given bit line. NAND strings are grouped into sets of strings that share common select gates. Thus, for example, NAND strings that are selected by SGS0 and SGD0 may be considered a set and may be designated as String 0, while NAND strings that are selected by SGS1 and SGD1 may be considered as a set and may be designated as String 1 as shown. A block may consist of any suitable number of such sets of strings. It will be understood that the cross-section of FIG. 10 shows portions of BL0-BL3, these bit lines extend further in the y-direction. Furthermore, additional bit lines extend parallel to BL0-BL3 (e.g. at different locations along x-axis, in front of, or behind the location of the cross-section of FIG. 10). Other three dimensional memories are based on resistive elements rather than charge storage elements.

Threshold Voltage Shifts

Ideally, programming results in memory cells having threshold voltage distributions that are narrowly centered within threshold voltage ranges that are assigned to particular logic states. However, real programmed memory cells may have threshold voltages that do not remain neatly within ideal ranges. Program disturbance may occur while programming neighboring cells. Read disturbance may occur while reading data from the cells, or from neighboring cells. Poor data retention (e.g. due to leakage of charge) may cause threshold voltages to change over time independent of access operations such as reads and writes. When memory cells with shifted threshold voltages are read there may be some bad bits (i.e. some bits that are read as storing the inverse of their programmed logic state). As the number of bad bits increases, the resources needed to perform Error Correction Code (ECC) correction of the data may increase. If the number of bad bits becomes too high then the data may be uncorrectable by ECC (UECC). It is generally desirable to avoid such outcomes.

FIGS. 11A-E illustrate how a population of memory cells may undergo threshold voltage shifting. FIG. 11A illustrates a population of memory cells (e.g. memory cells of a page, block, or other unit) in the erased state. FIG. 11B illustrates the memory cells after programming. The cells in this example store one bit each (SLC memory cells) with a lower memory state representing logic 1 and an upper memory state representing logic 0. A read voltage, rV, is shown, which may be used to read the population of memory cells. It can be seen that read voltage rV is between the distributions for logic 1 and logic 0 and thus allows accurate reading of the population of memory cells when they are programmed.

FIG. 11C illustrates the population of memory cells of FIG. 11B after a threshold voltage shift. In this example, threshold voltages are generally shifted upwards so that, for example, the distribution for logic 1 extends higher than before. It can be seen that the logic 1 distribution extends past read voltage rV so that a read using rV at this time would misread a significant number of memory cells that were programmed with logic 1 as storing logic 0. An accurate read could be obtained by using a modified read voltage, rV'. However, when data is shifted it may not be clear which modified read voltage should be used to obtain an accurate read, i.e. rV' is not easily determined.

One consequence of the threshold voltage shift shown in FIG. 11C is illustrated in FIGS. 11D-E. In FIG. 11B there were more memory cells read in the logic 1 state than in the logic 0 state as illustrated in FIG. 11D. However, over time a number of cells have threshold voltages increased so that, although they were originally programmed to logic 1 and were read as logic 1 using rV, they are subsequently read as logic 0 using rV. Thus, the distribution of memory cells to logic states changes over time as shown by the change between FIGS. 11D and 11E. the distribution of memory cells to logic states may be referred to as the "shape" of the data. The shape may be indicated by a number or numbers, ratio, percentage, or other indicator. The shape of a portion of data may be relatively easy to obtain in what may be referred to as a "bitscan" operation. The shape of data may change as threshold voltage shifts as illustrated by FIGS. 11D-E. According to examples described in detail below, such a change in shape may provide useful information. The change may be found by comparing the number of logic 1 bits (or logic 0 bits) before and after storage.

Figure 12:
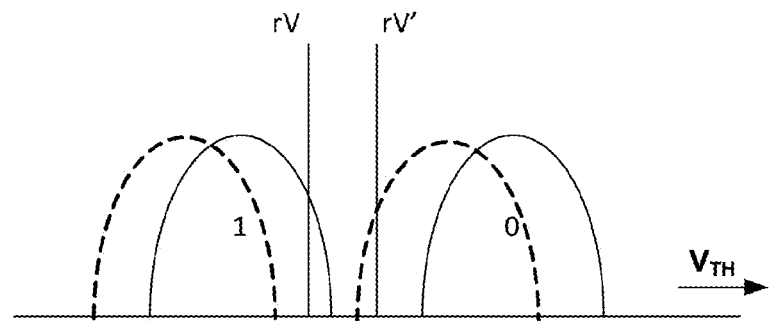
FIG. 12 illustrates data with shifted threshold voltages.

FIG. 12 shows another example of threshold voltages that are shifted upwards from newly-programmed distributions illustrated by dashed lines (read by rV) to shifted distributions illustrated by solid lines. Shifted distributions may be accurately read using rV' but are not accurately read using rV. Identifying a read voltage, such as rV', that can accurately read a population of memory cells that has undergone threshold voltage shifting may be done in a number of ways.

Figure 13:
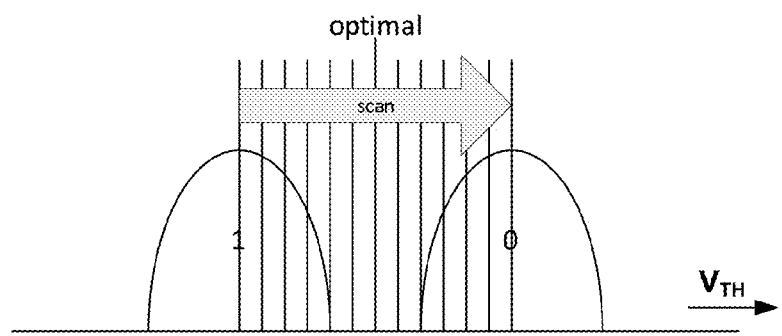
FIG. 13 scanning of shifted data using a range of read voltages.

One way to find a suitable read voltage is to try various different read voltages and attempt to correct the data using ECC or other scheme. FIG. 13 shows a first example in which multiple reads are performed with different read voltages so that a range of read voltages are scanned to find a read voltage that works (i.e. a read voltage that provides data that is correctable by ECC).

While only read voltage is changed in FIG. 13, it will be understood that other parameters may also be varied. For example, read-pass voltages and/or select voltages may be varied so that a range of different read conditions may be scanned.

In some cases, the read conditions may be limited to particular sets of conditions that may be predetermined. For example, particular read voltages (and other conditions, if appropriate) may be identified as providing a pattern that gives a good probability of finding a working read voltage within an acceptable time limit. In other cases conditions may be varied dynamically across a range. Some feedback may be provided so that read conditions are adjusted dynamically based on feedback from a prior read.

Figure 14:
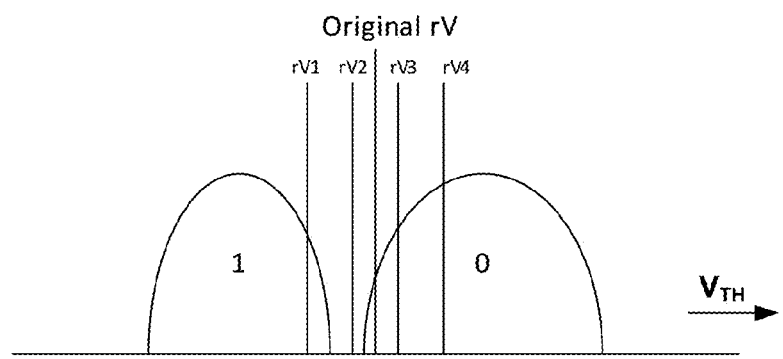
FIG. 14 illustrates a scheme applying sets of read conditions.

FIG. 14 shows an example of a scheme in which four different modified read voltages rV1-rV4 are tried when an original (default) read voltage (Original rV) fails (e.g.

returns UECC data). The four read voltages (rV1-rV4) are arranged above and below the original read voltage to account for threshold voltage shifting either up or down. In general, if a solution is not found after a predetermined number of tries, or a predetermined time, then rereading may terminate and an error may be returned (or the data may be recovered in another manner).

According to an example, a smart rereading scheme uses data shape information to predict reread conditions that are likely to provide good read data. For example, rather than simply attempting different read voltages in a predetermined order until a solution is found, a smart reread scheme may compare data shape before and after storage and thus identify whether threshold voltages have shifted up or down. The first reread voltages to try may be selected accordingly. For example, the decrease in threshold voltage of FIG. 14 increases the number of logic 1s and decreases the number of logic 0s. A smart rereading scheme may use this information to determine that threshold voltage has shifted down, and accordingly focus on reread voltages that are lower than the original read voltage (e.g. to rV1 and rV2, not rV3 or rV4). This generally reduces the time and resources needed to find working read conditions.

Data shape information may be stored when data is written. For example, the number, fraction, or percentage of memory cells programmed to a particular memory state, such as logic 0 may be recorded. This may be done for any suitable unit, for example, for a page, or block. A corresponding number may be calculated when the data is read out. These numbers are then compared to determine if there has been a change in shape, and if so, then the direction of the change (e.g. an increase or a decrease in the number of memory cells read as logic 0). The magnitude of the change may also be used to select reread conditions. In some memories, data may be scrambled, or randomized, so that there is an even distribution of memory cells different states, e.g. half of all bits are logic 0 and half are logic 1. Where data is scrambled it may not be necessary to record shape information. A bit may indicate that a portion of data is scrambled (if data is mixed). Data may also be shaped in other ways so that the shape of the data is known (i.e. shaping may not achieve a logic 1 to logic 0 ratio of 1:1 but may achieve another known ratio).

In some cases, selection is from a limited number of read conditions (e.g. a number of discrete read voltages). In other cases, selection may be made across a spectrum of read conditions that is not limited to particular values (e.g. read voltage may not be limited to discrete values).

Figure 15:
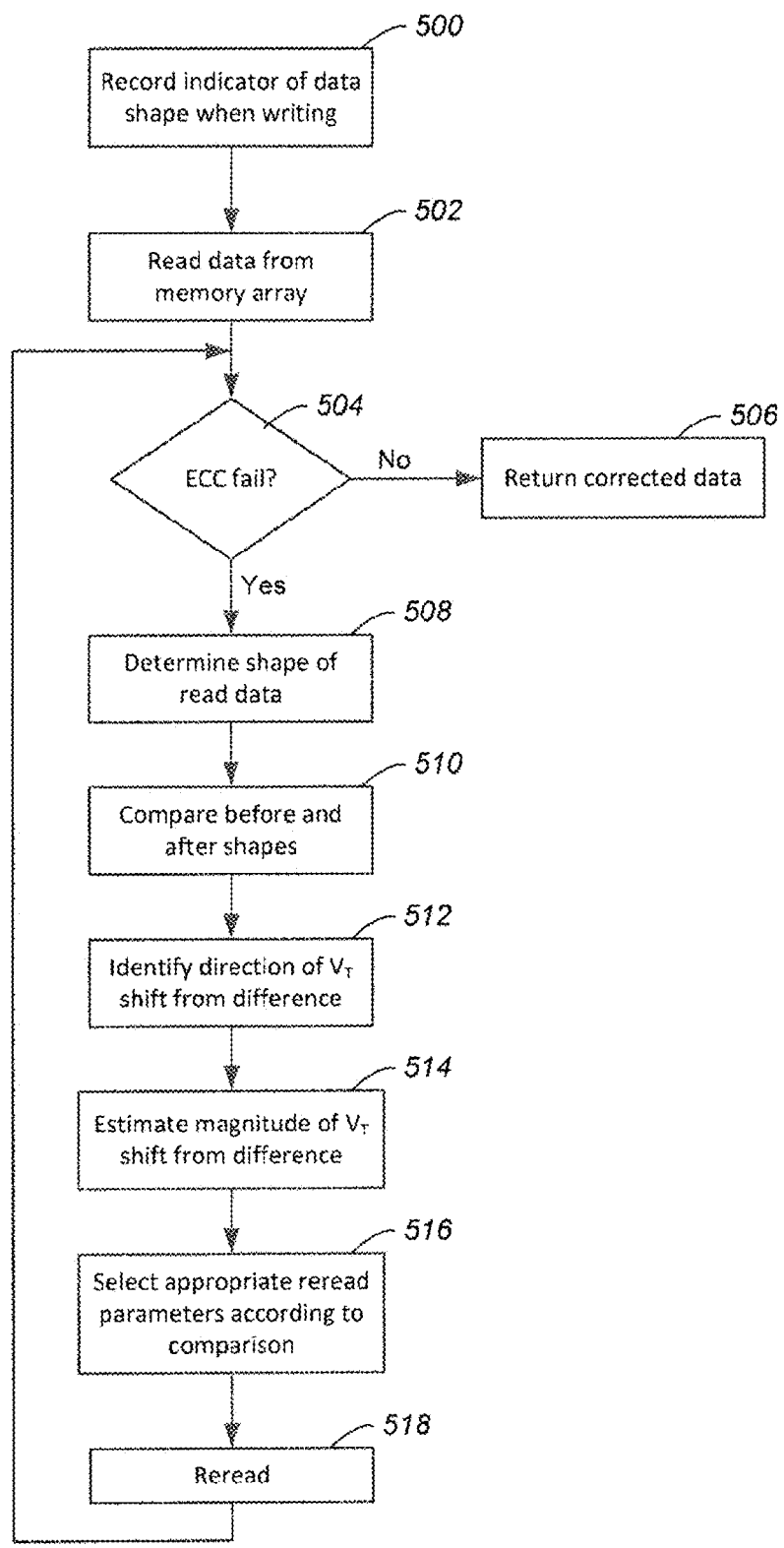
FIG. 15 illustrates a scheme for efficiently rereading data in a nonvolatile memory.

FIG. 15 illustrates a smart reread scheme for nonvolatile memory. When data is written in memory cells an indicator of data shape is recorded 500. This indicator may be written with the data in nonvolatile memory, or may be written at another location. If some data is scrambled or shaped, then scrambled or shaped data may be identified by an appropriate flag. If all data is scrambled then no indicator may be needed (i.e. initial data shape is known). Data is read from memory using a default set of read conditions 502. If there is no ECC fail 504 (i.e. if data is correctable) then the corrected data (read data decoded by ECC) is returned 506. However, if there is an ECC fail (data is uncorrectable by ECC) then the shape of the read data is determined 508. The shapes of the data before and after storage are compared 510. The direction of threshold voltage ($V_T$) shift is identified 512 from the difference in shape before and after storage. The magnitude of threshold voltage shift may also be estimated from the difference in shape 514. Then, reread parameters are selected 516 according to the comparison between data shape before and after storage. The selected parameters are then used to reread 518 the memory cells. The reread data is then decoded by ECC to determine if it can be corrected. Multiple iterations with different read parameters may be needed in some cases. If no correctable data is obtained after a predetermined time, or predetermined number of iterations, then rereading may terminate and an error may be returned.

Figure 16:
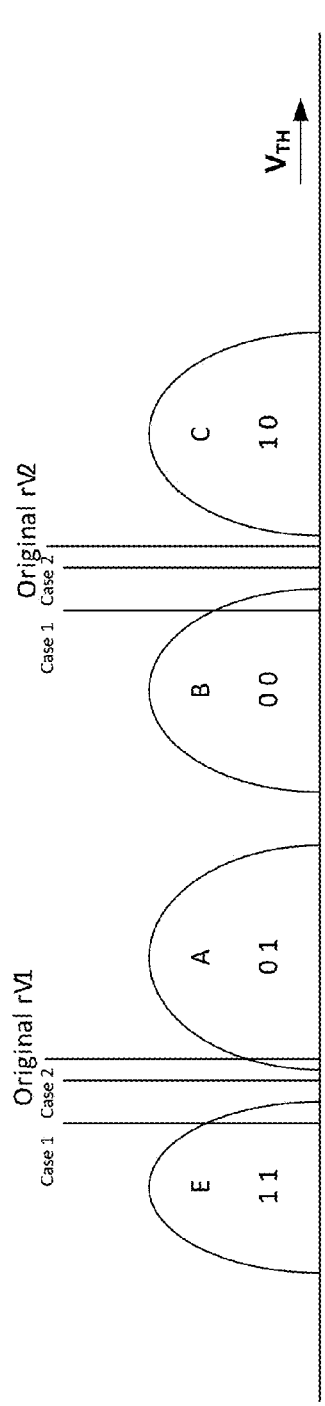
FIG. 16 illustrates an example of rereading an MLC memory.

While the above examples are applied to SLC memories that store one bit per cell using two memory states, other memories may store more than one bit per cell using more than two memory states in what may be referred to as multi-level cell (MLC) memory. For example, four memory states, using four different threshold voltage ranges, may be used to store two bits per cell. Eight memory states, using eight threshold voltage ranges, may be used to store three bits per cell, and so on. FIG. 16 illustrates an example of a population of MLC memory cells where original (default) read voltages provide a significant number of errors because of shifts in threshold voltage. In this example, threshold voltage distributions have shifted down (e.g. because of charge leakage over time). However, the individual memory state distributions have not shifted equally. While the A state has shifted downwards so that a significant number of cells that were programmed to the A state are below the original rV1 and are read as being in the E state, the C state has not shifted down as much. Thus, while read voltage rV1 may not provide an accurate read between E and A states, original rV2 may provide an accurate read between B and C states. If shape data is recorded for different states (or data is scrambled) then shape changes may be identified between memory states such as between E and A state. Thus, rereading between E and A states would be attempted using a pattern of read voltages that are lower than rV1 (case 1 and case 2) while no rereading would be performed between B and C states (i.e. original rV2, not case 1 or case 2).

In some MLC memories distributions for all memory states may be shifted by a similar amount which may make smart rereading more difficult. For example, in FIG. 16, a downward shift of all distributions would increase the number of cells read as having a logic 1 upper bit using rV1 but would decrease the number of cells read as having a logic 1 upper bit using rV2. Thus, these shifts may cancel each other out and may make the number of logic 0 and logic 1 bits about the same as before even though threshold voltages have shifted and data may be UECC. If instead all distribution were shifted up, the number of cells read as having a logic 1 upper bit using rV1 would decrease while the number of cells read as having logic 1 upper bit using rV2 would increase. Again, these tend to cancel out. Thus, shifts in either direction may tend to produce similar number of logic 1 and logic 0 bits when looking at upper bits from reads using both rV1 and rV2. A reread may be applied between one pair of memory states (e.g. between E and A states). The results of this retry may indicate whether distributions are shifted up or down. If suitable read conditions are found for reading between E and A states (e.g. case 2), then read conditions for reading between B and C states may be adjusted accordingly (case 2). For example, where shape data indicates that shifting is uniform across memory state distributions, then if a suitable read voltage between E and A states is ΔrV up or down from rV1, then it may be assumed that a suitable read voltage between B and C states is ΔrV in the same direction from rV2.

In some cases, a scheme applies predetermined sets of read conditions in order to obtain correctable data. Instead of applying a large number of such sets of read conditions to cover a range of possible threshold voltage shifts, a relatively small number of such sets may be applied based on information indicating the direction of the shift. For example, if a scheme includes an equal number of sets of read conditions that are adapted for increased threshold voltage and for decreased threshold voltage, then knowing the direction of threshold voltage shift may narrow the search to the sets of read conditions appropriate for such a shift, which may reduce the search to half the sets of read conditions and thus cut searching time by about half. If threshold voltages are shifted upwards, then read conditions adapted for increased threshold voltage are used. If threshold voltages are shifted downwards, then read conditions adapted for decreased threshold voltage are used. (For example, in FIG. 14, searching may focus either on rV1 and rV2, if threshold voltages are shifted down, or on rV3 and rV4, if threshold voltages are shifted up).

In addition to providing information regarding the direction of a threshold voltage shift, data shape information may provide an estimate of the magnitude of a threshold voltage shift. In general, the larger the change in shape the more the read conditions need to be modified. For example, a small change in shape may indicate a relatively small change in read voltage (and/or other read conditions) while a larger change in shape may indicate a larger change in read voltage (and/or other read conditions). While FIG. 16 shows a pattern of lower read voltages (case 1 and case 2) that is applied in response to determining that threshold voltages have shifted down, in other examples the magnitude of the threshold voltage shift may be obtained and may allow appropriate read conditions to be predicted (e.g. case 2 may be identified a read voltage with a high probability of success and case 1 may be skipped). Read latency may be reduced significantly from direction information alone, or from both direction and magnitude information.

Figure 17:
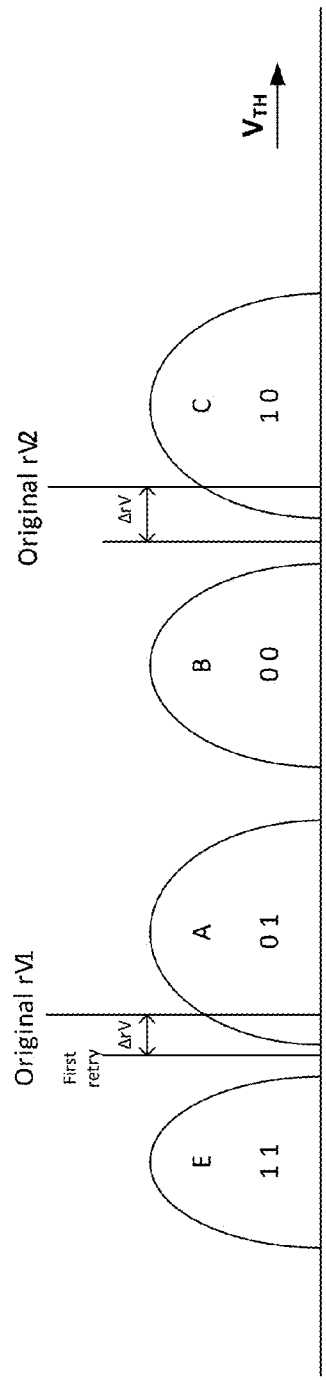
FIG. 17 illustrates another example of rereading an MLC memory.

FIG. 17 shows an example where a threshold voltage shift has occurred across all memory states. In this example, a read using original rV1 and rV2 provides data that is UECC. The shape of the data is compared with original data (recorded shape, or known scrambled shape). The direction of the threshold voltage shift is obtained. In this example, the number of cells read as having an upper page bit that is logic 0 decreases while the number of upper page logic 1 cells increases, when reading with rV1 only. This indicates that threshold voltages have shifted down. In addition, the magnitude of the shape change (e.g. the percentage drop in the number of cells read as having upper page bit logic 0) is used to estimate the magnitude of the threshold voltage shift $\Delta rV$, and the read voltage is modified accordingly by $\Delta rV$ for a first retry. If this is successful then a reread is also performed with the same offset, $\Delta rV$, from rV2. The relationship between data shape change and any change in read conditions such as read voltage depends on the memory and how memory states are mapped to threshold voltage. This relationship may be found empirically for a given memory. In some cases, the relationship between shape change and reread conditions may be established for a particular memory design and may be configured for all memories having that design. In some cases, the relationship may be found during testing (e.g. for each die) and may be die-specific (e.g. stored in a separate area in each die). In some cases, such a relationship may change over time so that a memory system may update a table or other record that indicates the relationship between data shape change and reread conditions for the memory or for a portion of the memory.

Figure 18:
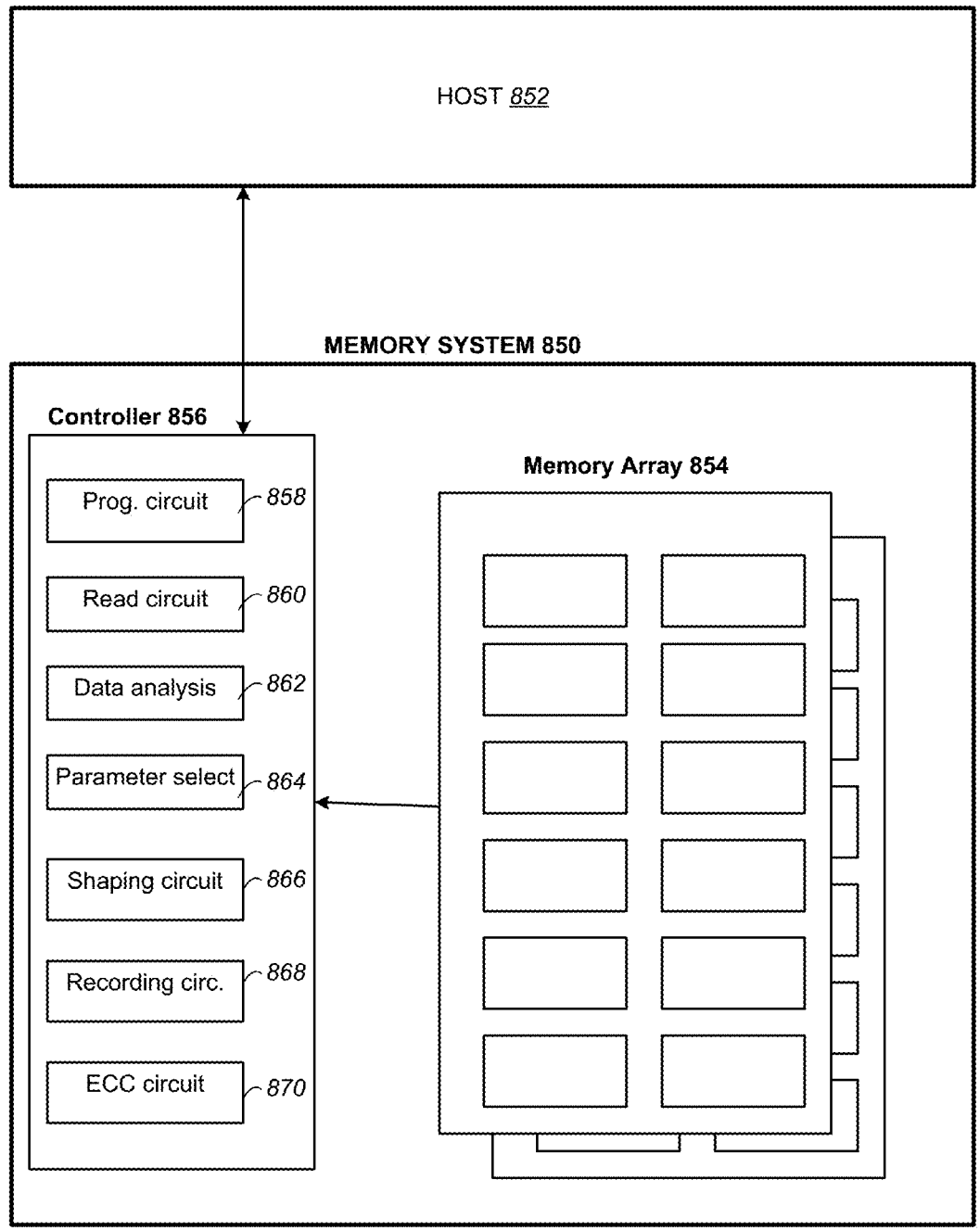
FIG. 18 illustrates components of a nonvolatile memory system.

FIG. 18 shows and example of a memory system 850 connected to a host 852. Memory system 850 includes a memory array 854 that includes multiple dies, each having multiple blocks of NAND flash memory cells. NAND flash memory cells may be arranged on a surface of a substrate or may be monolithically formed in multiple levels that are physically disposed above a substrate in a 3-D arrangement. Other array architectures may also be provided. Data may be stored in memory cells in SLC or MLC formats. Both formats may be used in a given memory. Memory controller 856 includes a program circuit 858 that programs data in memory array 854 and a read circuit 860 that reads data from memory array 854. A data analysis circuit 862 is provided to identify a difference in shape between data programmed by programming circuit 858 and data read by read circuit 860. For example, data analysis circuit 862 may identify a difference between a number of cells in a given unit that are programmed to a given state and a number of cells subsequently read as being in that state. A read parameter selection circuit 864 is configured to select read parameters, such as read voltage, read-pass voltage, select voltage, etc., according to the difference in shape identified by the data analysis circuit 862 (e.g. according to the different number of cells in a certain state). A data shaping circuit 866 is provided to shape data prior to storage. For example, data may be scrambled, or randomized, so that memory cells are evenly distributed across memory states. Alternatively, data may be transformed to have a more desirable shape (e.g. inverting some data to favor logic states mapped to lower threshold voltage ranges). A recording circuit 868 is configured to record shape information for data when the data is stored so that its initial shape may be compared with its shape when it is later read. ECC circuits 870 are configured to encode data prior to programming in the memory array and decode data that is read from the memory array. The above described components are shown in a memory controller. However, some or all of these components may be wholly or partially located elsewhere, in dedicated ICs, in a memory IC, or otherwise. Some or all components may be implemented as dedicated circuits in a controller that is formed as an application specific integrated circuit (ASIC). Components may also be implemented as configurable circuits such as programmable logic circuits (PLDs) or field programmable gate arrays (FPGAs) or the like. Components may also be implemented through software (e.g. firmware) operating in a controller to configure controller circuits for specific functions. Components may also be implemented through some combination of these approaches.

CONCLUSION

The foregoing detailed description has been presented for purposes of illustration and description. It is not intended to be exhaustive or to limit the attached claims. Many modifications and variations are possible in light of the above teaching.

It is claimed:
1. A method of operating a flash memory comprising:
   programming a population of memory cells to a plurality of states;
   recording an indicator of a first number of the memory cells programmed to a first state of the plurality of states;
   subsequently performing a first read operation using a first set of read parameters to identify a second number of the memory cells that are read as being in the first state;

determining a difference between the first number and the second number; and selecting a second set of read parameters for a second read according to the difference.

2. The method of claim 1 wherein the second set of read parameters is selected from a finite number of predetermined sets of read parameters.

3. The method of claim 2 wherein each of the finite number of predetermined sets of read parameters includes a different read voltage to be applied to a selected word line.

4. The method of claim 3 wherein the finite number of predetermined sets of read parameters include predetermined sets with higher read voltages and predetermined sets with lower read voltages, the second set of read parameters selected from sets with either higher or lower read voltages according to whether the difference is positive or negative.

5. The method of claim 4 further comprising subsequently selecting a third set of read parameters, the third set of read parameters having a higher read voltage if the second set of read parameters has a higher read voltage and the third set of read parameters having a lower read voltage if the second set of read parameters has a lower read voltage.

6. The method of claim 1 wherein the plurality of states includes three or more states per cell including the first state and a second state, and wherein an additional indicator is maintained of a number of memory cells programmed to the second state.

7. The method of claim 6 wherein indicators of numbers of memory cells programmed to each of the plurality of states are maintained.

8. The method of claim 1 wherein the plurality of states includes three or more states per cell, memory cells programmed to the first state having higher threshold voltages than any other state of the plurality of states, and wherein no indicators are maintained of numbers of the memory cells programmed to other states of the plurality of states.

9. The method of claim 1 wherein the indicator is a bit indicating that data is scrambled so that the population of memory cells is evenly distributed across the plurality of states.

10. The method of claim 1 wherein the indicator of the first number of the memory cells programmed to the first state of the plurality of states is recorded in the flash memory when programming the population of memory cells to the plurality of states.

11. A method of operating a flash memory comprising:
reading a plurality of memory cells that store host data using a default set of read parameters;
identifying a first number of memory cells of the plurality of memory cells that were read as being in a first state using the default set of read parameters, the first number of memory cells storing host data;
comparing the first number with an expected number of memory cells in the first state;
if a difference between the first number and the expected number is less than a limit, then sending the host data from the plurality of memory cells, including host data from the first number of memory cells, read using the default set of read parameters to a memory controller; and
if the difference between the first number and the expected number is greater than the limit, then rereading the plurality of memory cells using a modified set of read parameters, the modified set of read parameters chosen from a number of predefined sets of read parameters according to whether the difference is positive or negative.

12. The method of claim 11 wherein the memory cells are programmed to two memory states to store one bit per cell and the data is scrambled so that the expected number of memory cells is half of the plurality of memory cells.

13. The method of claim 11 wherein the memory cells are programmed to more than two memory states to store n bits per cell, where n is greater than 1, and the data is scrambled so that the expected number of memory cells is 1/nth of the plurality of memory cells.

14. The method of claim 11 further comprising, prior to reading the plurality of memory cells, storing an indicator of the number of memory cells in the first state, the expected number obtained from the indicator of the number of memory cells in the first state.

15. The method of claim 14 wherein the memory cells are programmed to more than two memory states to store n bits per cell, and further comprising, prior to reading the plurality of memory cells, storing indicators of the numbers of memory cells in two or more of the memory states.

16. The method of claim 11 wherein the limit reflects a number of bad bits that is correctable by error correction code.

17. A NAND flash memory system comprising:
a plurality of flash memory cells each storing one or more bits of data;
a read circuit configured to perform read operations using predefined sets of read parameters;
a recording circuit configured to record, in the plurality of flash memory cells, data shape information including a first number of the plurality of flash memory cells programmed to a first state;
a data analysis circuit configured to identify a difference between the first number of the plurality of flash memory cells programmed to the first state and a second number of the plurality of flash memory cells that are read by the read circuit as being in the first state using a first predefined set of read parameters; and
a read parameter selection circuit configured to select a second predefined set of read parameters for the read circuit to reread the plurality of flash memory cells according to the difference identified by the data analysis circuit.

18. The NAND flash memory of claim 17 further comprising a data scrambling circuit that scrambles data prior to storing scrambled data in the plurality of flash memory cells.

19. The NAND flash memory of claim 17 wherein the plurality of flash memory cells store more than one bit of data in more than two states per cell including the first state and a second state, and wherein the recording circuit record the first number and a second number of the flash memory cells in the second state.

20. The NAND flash memory of claim 17 further comprising an error correction code circuit that corrects errors in data read from the plurality of flash memory cells.

21. The NAND flash memory of claim 17 wherein the NAND flash memory is a three-dimensional memory that monolithically formed in one or more physical levels of arrays of memory cells having an active area disposed above a silicon substrate.

* * * * *